US007141917B2

(12) United States Patent
Beck et al.

(10) Patent No.: US 7,141,917 B2
(45) **Date of Patent: *Nov. 28, 2006**

(54) INDIUM OR TIN BONDED ACOUSTIC TRANSDUCER SYSTEMS

(75) Inventors: Mark J. Beck, Los Gatos, CA (US); Richard B. Vennerbeck, Los Gatos, CA (US)

(73) Assignee: Product Systems Incorporated, Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/150,618

(22) Filed: Jun. 10, 2005

(65) Prior Publication Data

US 2005/0225204 A1 Oct. 13, 2005

Related U.S. Application Data

(63) Continuation of application No. 10/185,917, filed on Jun. 27, 2002, now Pat. No. 6,904,921, which is a continuation-in-part of application No. 09/841,703, filed on Apr. 23, 2001, now Pat. No. 6,722,379, which is a continuation-in-part of application No. 09/384,947, filed on Aug. 27, 1999, now Pat. No. 6,188,162.

(51) Int. Cl.
*H01L 41/04* (2006.01)

(52) U.S. Cl. ........................................................ 310/334

(58) Field of Classification Search ................ 310/322, 310/323.01, 323.02, 328, 334
See application file for complete search history.

(56) References Cited

U.S. PATENT DOCUMENTS

| | | | | |
|---|---|---|---|---|
| 3,235,943 | A * | 2/1966 | James | 29/601 |
| 5,898,255 | A * | 4/1999 | Kishima et al. | 310/330 |
| 6,222,305 | B1 * | 4/2001 | Beck et al. | 310/334 |
| 6,722,379 | B1 * | 4/2004 | Beck et al. | 134/184 |
| 6,904,921 | B1 * | 6/2005 | Beck et al. | 134/184 |
| 2002/0153806 | A1 * | 10/2002 | Beck et al. | 310/323.19 |

FOREIGN PATENT DOCUMENTS

| | | | |
|---|---|---|---|
| JP | 57-013784 | * | 1/1982 |
| JP | 58-64814 | * | 4/1983 |
| JP | 63-299182 | * | 12/1988 |
| JP | 03-099855 | * | 4/1991 |
| JP | 03-142248 | * | 6/1991 |

* cited by examiner

*Primary Examiner*—Thomas M. Dougherty
(74) *Attorney, Agent, or Firm*—Donald J. Pagel

(57) ABSTRACT

An acoustic transducer comprised of a resonator, an acoustic energy generating means, such as one or more piezoelectric crystals, and a bonding layer comprised of indium or tin for attaching the acoustic energy generating means to the resonator. The resonator comprises a material selected from the group consisting of quartz, sapphire, silicon carbide, silicon nitride, aluminum, ceramics and stainless steel. The resonator may form a detachable part of a container or the acoustic energy generating means may be attached directly to a side or to the bottom of the container, in which case a part of the container acts as the resonator.

20 Claims, 8 Drawing Sheets

INDIUM OR TIN BONDED ACOUSTIC TRANSDUCER SYSTEMS

This application is a continuation of application Ser. No. 10/185,917, filed Jun. 27, 2002, now U.S. Pat. No. 6,904,921, which is a continuation-in-part of Ser. No. 09/841,703, filed Apr. 23, 2001, now U.S. Pat. No. 6,722,379, which is a continuation-in-part of Ser. No. 09/384,947, filed Aug. 27, 1999, now U.S. Pat. No. 6,222,305, which is a continuation-in-part U.S. Pat. No. 6,188,162.

BACKGROUND OF THE INVENTION

1. Technical Field

The present invention relates to megasonic cleaning systems having a chemically inert resonator and a piezoelectric crystal and more particularly to a system in which the crystal is bonded to the resonator using tin or indium.

2. Background Information

It is well-known that sound waves in the frequency range of 0.4 to 2.0 megahertz (MHZ) can be transmitted into liquids and used to clean particulate matter from damage sensitive substrates. Since this frequency range is predominantly near the megahertz range, the cleaning process is commonly referred to as megasonic cleaning. Among the items that can be cleaned with this process are semiconductor wafers in various stages of the semiconductor device manufacturing process, disk drive media, flat panel displays and other sensitive substrates.

Megasonic acoustic energy is generally created by exciting a crystal with radio frequency AC voltage. The acoustical energy generated by the crystal is passed through an energy transmitting member and into the cleaning fluid. Frequently, the energy transmitting member is a wall of the vessel that holds the cleaning fluid. The crystal and its related components are referred to as a megasonic transducer. For example, U.S. Pat. No. 5,355,048, discloses a megasonic transducer comprised of a piezoelectric crystal attached to a quartz window by several attachment layers. The megasonic transducer operates at approximately 850 KHz. Similarly, U.S. Pat. No. 4,804,007 discloses a megasonic transducer in which energy transmitting members comprised of quartz, sapphire, boron nitride, stainless steel or tantalum are glued to a piezoelectric crystal using epoxy.

It is also known that piezoelectric crystals can be bonded to certain materials using indium. For example, U.S. Pat. No. 3,590,467 discloses a method for bonding a piezoelectric crystal to a delay medium using indium where the delay medium comprises materials such as glasses, fused silica and glass ceramic.

A problem with megasonic transducers of the prior art is that the acoustic power that can be generated by the megasonic transducer in the cleaning solution is limited to about 10 watts per $cm^2$ of active piezoelectric surface without supplying additional cooling to the transducer. For this reason, most megasonic power sources have their output limited, require liquid or forced air cooling or are designed for a fixed output to the piezoelectric transducer or transducers. Typically, fixed output systems are limited to powers of 7–8 watts/$cm^2$. This limits the amount of energy that can be transmitted to the cleaning solution. If more power is applied to the transducer, the crystal can heat up to the point where it becomes less effective at transmitting energy into the cleaning solution. This is caused either by nearing the maximum operating temperature of the crystal or, more often, by reaching the failure temperature of the material used to attach the crystal to the energy transmitting means.

Another problem with prior art cleaning systems that utilize megasonic transducers, is that there is no practical way of replacing a defective transducer once the transducer has been attached to the cleaning system. This means that users have to incur large expenses to replace defective transducers, for example by purchasing a whole new cleaning vessel.

SUMMARY OF THE PRESENT INVENTION

Briefly, the present invention is a megasonic cleaning system comprised of a resonator, one or more piezoelectric crystals and a tin or indium bonding layer for attaching the piezoelectric crystal (or crystals) to the resonator. The resonator comprises a material selected from the group consisting of quartz, sapphire, silicon carbide, silicon nitride, aluminum, ceramics and stainless steel.

The resonator may comprise a strip resonator or a one-piece cleaning tank. In the case of a one-piece cleaning tank, the piezoelectric crystal (or crystals) is attached directly to the sides or bottom of the tank. In the case of a strip resonator, the crystals are attached to the strip resonator, and the resonator is incorporated into a part of a cleaning tank.

The piezoelectric crystal (or crystals) is capable of generating acoustic energy in the frequency range of 0.4 to 2.0 MHz when power is applied to the crystal. The attachment layer is comprised of indium and is positioned between the tank and the piezoelectric crystal so as to attach the piezoelectric crystal to the tank. A first adhesion layer comprised of chromium, copper and nickel is positioned in contact with a surface of the piezoelectric crystal. A first wetting layer comprised of silver is positioned between the first adhesion layer and the bonding layer for helping the bonding layer bond to the first adhesion layer.

One way of attaching the crystal to the resonator involves the use of a combination layer. This is especially useful when the resonator is a single piece tank. The combination layer is applied to the region of the tank or resonator to which the crystal is to be attached. The combination layer helps the indium or tin bonding layer bond to the tank or resonator, and preferably comprises a silver conductive emulsion (paste) that is applied to the tank or resonator using a screen print process.

Alternatively, the combination layer can be replaced by a second adhesion layer and a second wetting layer. The second adhesion layer is comprised of chromium, copper and nickel and is positioned in contact with a surface of the tank. The second wetting layer is comprised of silver and is positioned between the second adhesion layer and the bonding layer for helping the bonding layer bond to the second adhesion layer.

DETAILED DESCRIPTION OF THE INVENTION

Figure 1:
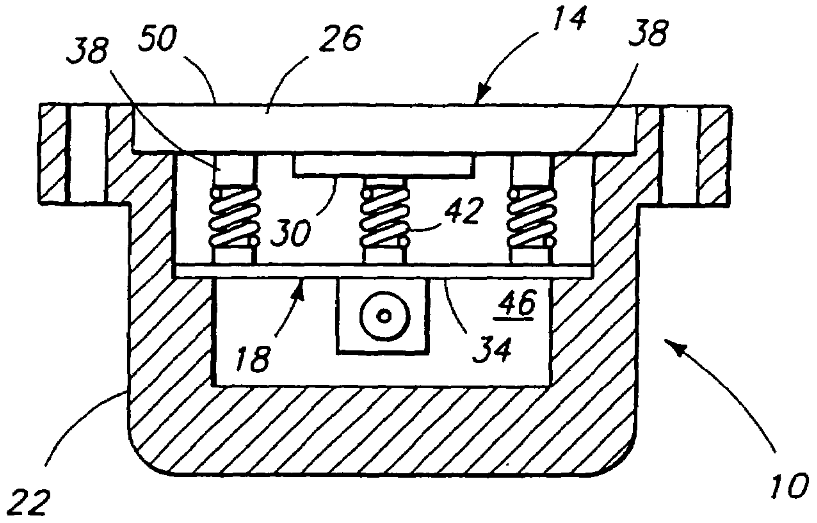
FIG. 1 is a cross-sectional view of an acoustic transducer assembly according to the present invention.

FIG. 1 illustrates a cross section of an acoustic transducer assembly 10 comprised of an acoustic transducer 14, a spring/button electrical connector board 18 and a housing 22. The transducer 14 comprises a resonator 26 which is bonded to a piezoelectric crystal 30. The electrical connector board 18 comprises a printed circuit board (PCB) 34 which has a plurality of first spring/button connectors 38 and a plurality of second spring/button connectors 42 connected to it. The housing 22 is a case that encloses the electrical connector board 18 so that it is protected from the environment. The electrical connector board 18 and the acoustic transducer 14 sit in a cavity 46 inside the housing 22.

The resonator 26 forms part of a wall in the housing 22 that covers and seals the cavity 46. A surface 50 of the resonator 26 forms an external side of the acoustic transducer assembly 10. In the preferred embodiment, the acoustic transducer 14 is used to generate megasonic acoustic energy in a cleaning apparatus used to clean semiconductor wafers. The surface 50 will be in contact with the cleaning fluid used in the cleaning apparatus.

Figure 2:
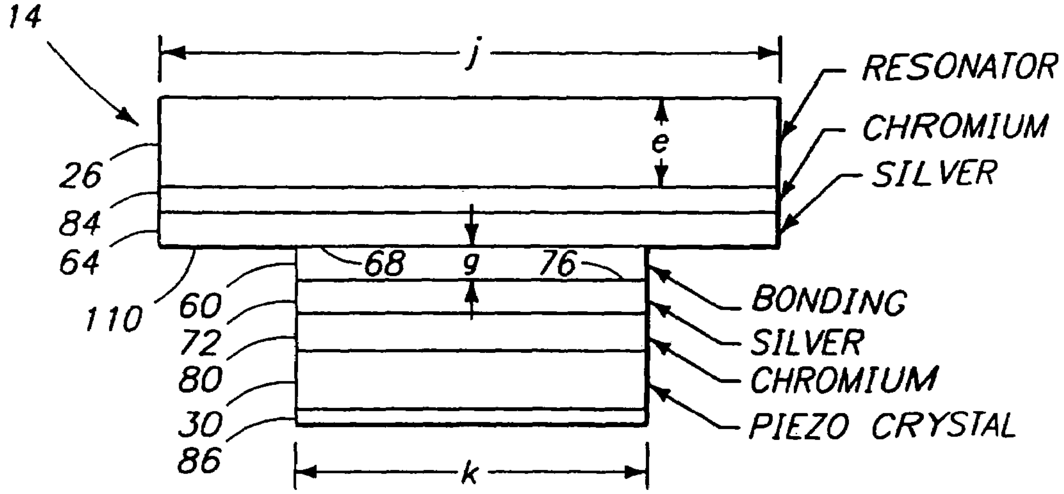
FIG. 2 is a side view of an acoustic transducer according to the present invention.

FIG. 2 illustrates that the acoustic transducer 14 comprises the piezoelectric crystal 30 attached to resonator 26 by a bonding layer 60. In the preferred embodiment, a plurality of other layers are disposed between the piezoelectric crystal 30 and the resonator 26 to facilitate the attachment process. Specifically, a first metal layer 64 is present adjacent to a front surface 68 of the bonding layer 60. A second metal layer 72 is present adjacent to a back surface 76 of the bonding layer 60. A blocking layer 80 is positioned between the metal layer 72 and the piezoelectric crystal 30 to promote adhesion. In the preferred embodiment, the blocking layer 80 comprises a chromium-nickel alloy, and the metal layers 64 and 72 comprise silver. The blocking layer 80 has a minimum thickness of approximately 500 Å and the metal layer 72 has a thickness of approximately 500 Å.

In one embodiment, the piezoelectric crystal 30 is comprised of lead zirconate titanate (PZT). However, the piezoelectric crystal 30 can be comprised of many other piezoelectric materials such as barium titanate, quartz or polyvinylidene fluoride resin (PVDF), as is well-known in the art. In one embodiment, two rectangularly shaped PZT crystals are used in the transducer 14, and each PZT crystal is individually excited.

A blocking/adhesion layer 84 separates the metal layer 64 from the resonator 26. In the preferred embodiment, the blocking/adhesion layer 84 comprises a layer of nickel chromium alloy which is approximately 500 Å thick. However, other materials and/or thicknesses could also be used as the blocking layer 84. The function of the blocking layer 84 is to provide an adhesion layer for the metal layer 64. In the preferred embodiment, the metal layer 64 comprises silver and has a thickness of approximately 500 Å. However, other metals and/or thicknesses could be used for the metal layer 64. The function of the metal layer 64 is to provide a wetting surface for the molten indium.

An additional layer is also disposed on a back side of the piezoelectric crystal 30. Specifically, a metal layer 86 is positioned on the back side of the piezoelectric crystal 30 and covers substantially all of the surface area of the back side of the crystal 30. Generally, the layer 86 is applied to the piezoelectric crystal 30 by the manufacturer of the crystal. The layer 86 functions to conduct electricity from a set of the spring/button connectors shown in FIG. 1, so as to set up a voltage across the crystal 30. Preferably, the metal layer 86 comprises silver, nickel or another electrically conductive layer.

In the preferred embodiment, the bonding layer 60 comprises pure indium (99.99%) such as is commercially available from Arconium or Indalloy. However, indium alloys containing varying amounts of impurity metals can also be used. The benefit of using pure indium and its alloys is that indium possesses excellent shear properties that allow dissimilar materials with different coefficients of expansion to be attached together and experience thermal cycling without damage to the attached materials. Similarly, when tin is used as the bonding layer 60, it is preferable to use pure tin (99.99% tin). However, tin containing varying amounts of impurities, including other metals, can also be used.

In the preferred embodiment, the resonator 26 is a piece of sapphire ($Al_2O_3$). Preferably, the sapphire is high grade having a designation of 99.999% (5,9s+purity). However, other materials, such as stainless steel, tantalum, aluminum, silica compounds (including quartz), ceramics and plastics, can also function as the resonator 26. The purpose of the resonator 26 is to separate (isolate) the piezoelectric crystal 30 from the fluid used in the cleaning process, so that the fluid does not damage the crystal 30. Thus, the material used as the resonator 26 is usually dictated, at least in part, by the nature of the fluid. The resonator 26 must also be able to transmit the acoustic energy generated by the crystal 30 into the fluid. Sapphire is a desirable material for the resonator 26 when the items to be cleaned by the megasonic cleaning apparatus require parts per trillion purity. For example, semiconductor wafers require this type of purity.

In the preferred embodiment, the resonator 26 has a thickness "e" which is preferably a multiple of one-half of the wavelength of the acoustic energy emitted by the piezoelectric crystal 30, so as to minimize reflectance problems. For example, "e" is approximately six millimeters for sapphire and acoustic energy of about 925 KHz.

Figure 3:
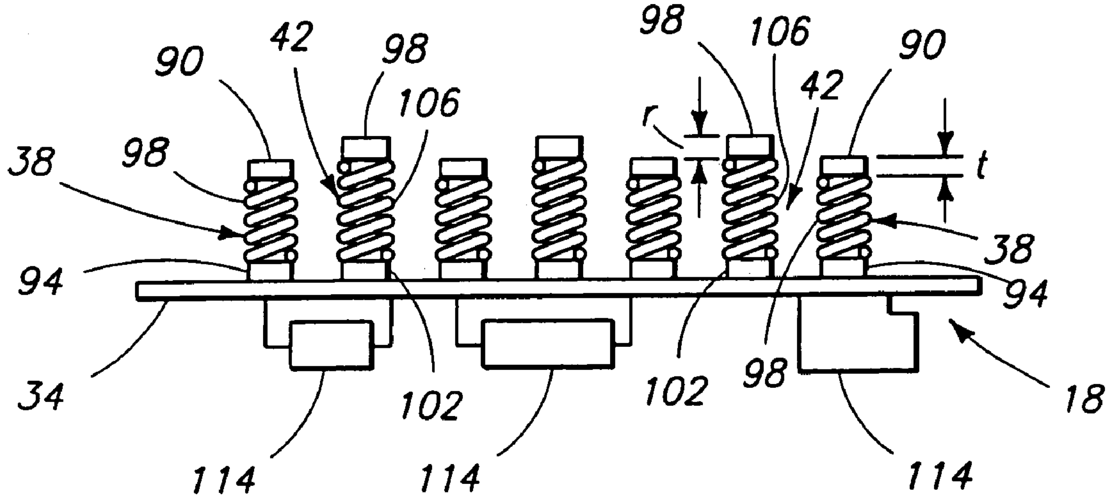
FIG. 3 is side view of a spring/button electrical connector board according to the present invention.

FIG. 3 illustrates the spring/button electrical connector board 18 in more detail. Each first spring/button connector 38 comprises an upper silver button 90 and a lower silver button 94. The upper silver button 90 and the lower silver button 94 are attached to a plated silver spring 98 and soldered to the printed circuit board (PCB) 34 so that the connector 38 can provide an electrical connection to the acoustic transducer 14. The upper silver button 90 has a thickness "t" of about 0.15 inches.

Similarly, each second spring/button connector 42 comprises an upper silver button 98 and a lower silver button 102. The upper silver button 98 and the lower silver button 102 are attached to a silver plated spring 106 and soldered to the PCB 34 so that the connector 42 can provide an electrical connection to the acoustic transducer 14. The upper silver button 98 has a thickness "r" of about 0.10 inches. Generally, the thickness "t" is greater than the thickness "r" because the first spring/button connector 38 has extend farther up to make contact with the acoustic transducer 14 than does the second spring/button connector 42 (see FIGS. 1 and 2).

A radio frequency (RF) generator provides a voltage to the PCB 34. The PCB 34 includes electrical connections to the spring/button connectors 38 and 42 so that the polarity of the spring/button connectors 38 is positive and the polarity of the spring/button connectors 42 is negative, or vice versa. Examination of FIG. 2 shows that in the acoustic transducer 14, the layers 26, 84 and 64 have a greater length "j" than the length "k" of the layers 60, 72, 80, 30 and 86. This creates a step-region 110 on the silver layer 64 that can be contacted by the upper buttons 90 of the spring/button connectors 38. The upper buttons 98 of the spring/button connectors 42 make electrical contact with the silver layer 86.

The purpose of the spring/button connectors 38 and 42 is to create a voltage difference across the piezoelectric crystal 30 so as to excite it at the frequency of the RF voltage supplied by the RF generator. The connectors 38 connect the metal layer 64 to the RF generator. The connectors 42 connect the layer 86 to the RF generator. The RF generator delivers a RF alternating current to the piezoelectric crystal 30 via the connectors 38 and 42. Preferably, this is a 925 KHz signal, at 600 watts of power. The effective power in the piezoelectric crystal 30 is approximately 15.5 watts/$cm^2$. The effective power in the piezoelectric crystal 30 is defined as the forward power into the crystal 24 minus the reflected power back into the RF generator. Thus, the step-region 110, and the spring/button connectors 38 and 42, allow a voltage to be set up across the piezoelectric crystal 30 without the need for soldering discrete leads to the layers 64 and 86.

In FIG. 3, a plurality of electrical components 114, such as capacitors and/or inductors, are shown. These are used to balance the impedance between the RF input and the spring output.

Figure 4:
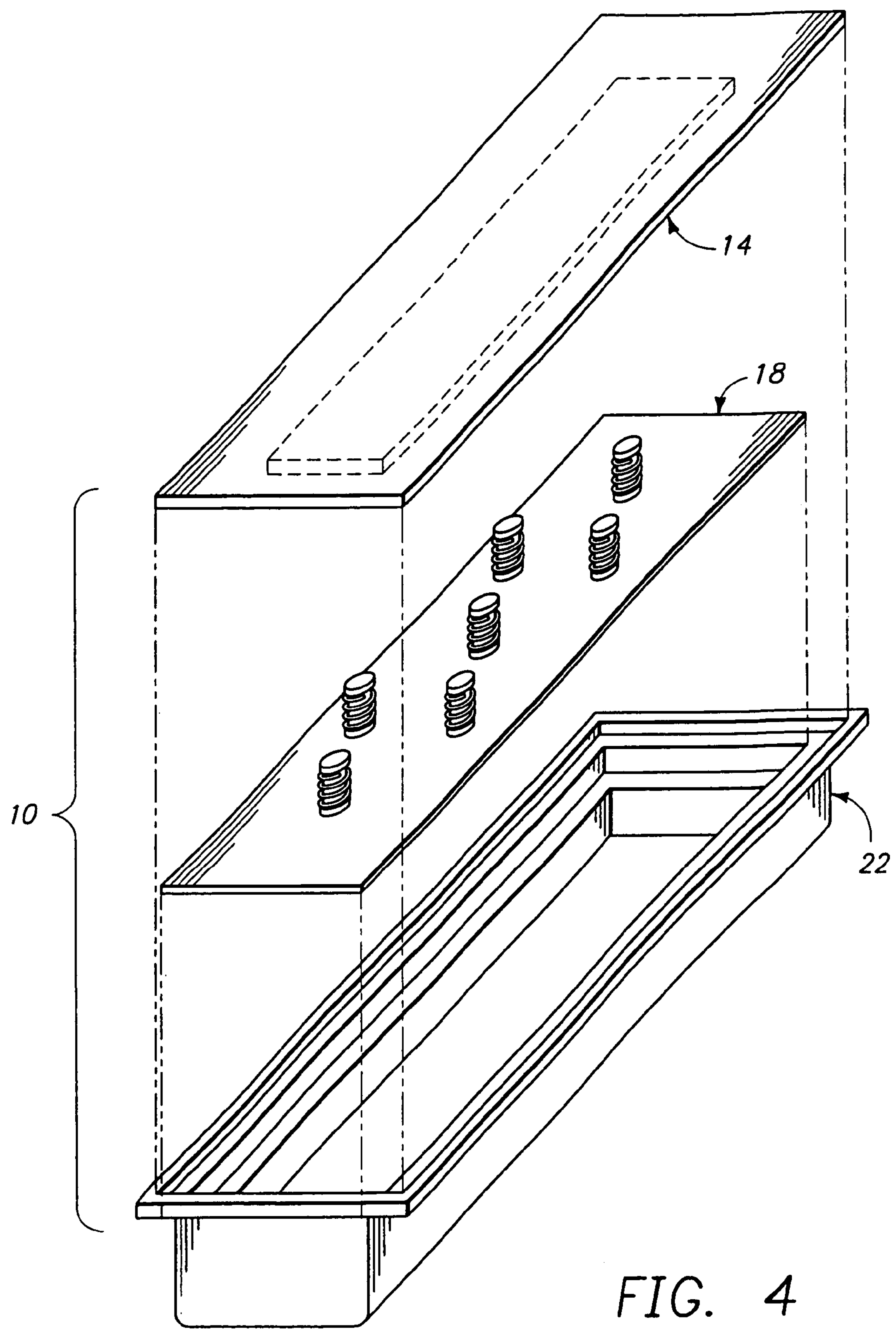
FIG. 4 is an exploded view of the acoustic transducer assembly according to the present invention.

FIG. 4 illustrates the way the acoustic transducer 14, the spring/button electrical connector board 18 and the housing 22 fit together to form the acoustic transducer assembly 10.

The acoustic transducer 14 (shown in FIG. 2) is prepared as follows (using the preferred materials described previously): Assuming that the resonator 26 is sapphire, the surface of the sapphire that will be adjacent to the layer 84 is cleaned by abrasive blasting or chemical or sputter etching. The blocking/adhesion layer 84 is then deposited on the resonator 26 by physical vapor deposition ("PVD"), such as argon sputtering. A plating technique could also be used. The silver layer 64 is then deposited on the chromium blocking/adhesive layer 84 using argon sputtering. A plating technique could also be used.

The piezoelectric crystal 30 may be purchased with the layer 86 already applied to it. The blocking layer 80 and the metal layer 72 are deposited on the crystal 30 by plating or physical vapor deposition.

If indium is used as the bonding layer 60, the resonator 26 and the piezoelectric crystal 30 are both heated to approximately 200° C., preferably by placing the resonator 26 and the crystal 30 on a heated surface such as a hot-plate. When both pieces have reached a temperature of greater than 160° C., solid indium is rubbed on the surfaces of the resonator 26 and the crystal 30 which are to be attached. Since pure indium melts at approximately 157° C., the solid indium liquefies when it is applied to the hot surfaces, thereby wetting the surfaces with indium. It is sometimes advantageous to add more indium at this time by using the surface tension of the indium to form a "puddle" of molten indium.

If tin is used as the bonding layer 60, the procedure described in the preceding paragraph is used, but tin is used in place of indium and the resonator 26 and the crystal 30 are heated to approximately 240° C. Since pure tin melts at 231.9° C., the tin is not applied to the resonator 26 and the crystal 30 until both pieces have reached a temperature of approximately 240° C.

The resonator 26 and the piezoelectric crystal 30 are then pressed together so that the surfaces coated with indium or tin are in contact with each other, thereby forming the transducer 14. The newly formed transducer 14 is allowed to cool to room temperature so that the indium or tin solidifies. Preferably, the solid bonding layer 60 has a thickness "g" which is just sufficient to form a void free bond (i.e. the thinner the better). In the preferred embodiment, "g" is approximately one mil (0.001 inches). Thicknesses up to about 0.01 inches could be used, but the efficiency of acoustic transmission drops off when the thickness "g" is increased.

Preferably, the transducer 14 is allowed to cool with the piezoelectric crystal 30 on top of the resonator 26 and the force of gravity holding the two pieces together. Alternatively, a weight can be placed on top of the piezoelectric crystal 30 to aide in the bonding of the indium. Another alternative is to place the newly formed transducer 14 in a clamping fixture. Once the transducer 14 has cooled to room temperature, any excess indium or tin that has seeped out from between the piezoelectric crystal 30 and the resonator 26, is removed with a tool or other means.

Figure 5:
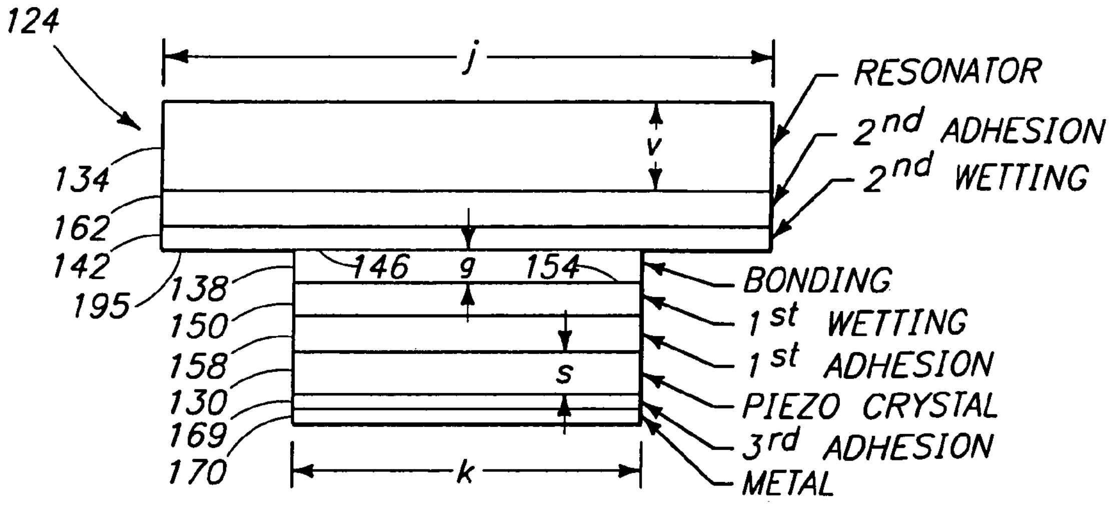
FIG. 5 is a side view of an acoustic transducer according to the present invention.

FIG. 5 illustrates a preferred embodiment of an acoustic transducer system 124 in which the resonator can be one of several chemically inert materials. These materials include sapphire, quartz, silicon carbide, silicon nitride, aluminum, stainless steel and ceramics. The transducer system 124 shown in FIG. 5 is similar to the transducer 14 shown in FIG. 2. However, several of the attachment layers used in the transducer system 124 are different.

In FIG. 5, the acoustic transducer system 124 comprises a piezoelectric crystal 130 attached to a resonator 134 by a bonding layer 138. A plurality of attachment layers are disposed between the piezoelectric crystal 130 and the resonator 134 to facilitate the attachment process. Specifically, a second wetting layer 142 is present adjacent to a front surface 146 of the bonding layer 138. A first wetting layer 150 is present adjacent to a back surface 154 of the bonding layer 138. A first adhesion layer 158 is positioned between the first wetting layer 150 and the piezoelectric crystal 130 to facilitate the mechanical adhesion of the bonding layer 138 to the crystal 130. The bonding layer 138 comprises a solderable material such as indium or tin.

In the preferred embodiment, the first adhesion layer 158 comprises an approximately 5000 Å thick layer of an alloy comprised of chrome and a nickel copper alloy, such as the alloys marketed under the trademarks Nickel 400™ or MONEL™. However, other materials and/or thicknesses could also be used as the first adhesion layer. 158. Nickel 400™ and MONEL™ are copper nickel alloys comprised of 32% copper and 68% nickel.

Preferably, the wetting layers 142 and 150 comprise silver. The wetting layers 142 and 150 each have a thickness of approximately 5000 Å. However, other metals and/or thicknesses could be used for the wetting layers 142 and 150. The function of the wetting layers 142 and 150 is to provide a wetting surface for the molten indium or tin, meaning that the layers 142 and 150 help the bonding layer 138 adhere to the first adhesion layer 158 and a second adhesion layer 162, respectively. It is thought that the silver in the wetting layers 142 and 150 forms an alloy with the indium or tin, thereby helping the bonding layer 138 adhere to the adhesion layers 158 and 162. The transducer system 124 includes a step-region 195 in the wetting layer 142 which is exactly analogous to the step-region 110 described previously with respect to FIG. 2.

In the preferred embodiment, the piezoelectric crystal 130 is identical to the piezoelectric crystal 30 already described, and is comprised of lead zirconate titanate (PZT). However, many other piezoelectric materials such as barium titanate, quartz or polyvinylidene fluoride resin (PVDF), may be used as is well-known in the art. In the preferred embodiment, four rectangularly shaped PZT crystals are used in the transducer 14 (shown in FIG. 6), and each PZT crystal is individually excited. However, other numbers of the crystals 130 can be used, including between one and sixteen of the crystals 130, and other shapes, such as round crystals, could be used.

The second adhesion layer 162 separates the second wetting layer 142 from the resonator 134. In the preferred embodiment, the adhesion layer 162 comprises an approximately 5000 Å thick layer of an alloy comprised of chrome and a nickel copper alloy, such as the alloys marketed under the trademarks Nickel 400™ or MONEL™. However, other materials and/or thicknesses could also be used as the second adhesion layer 162.

The function of the first adhesion layer 158 is to form a strong bond between the bonding layer 138 and the piezoelectric crystal 130. As noted previously, the wetting layer 150 forms an alloy with the indium or tin in the bonding layer 138, thereby permitting the adhesion layer 158 to bond with the bonding layer 138. Similarly, the function of the second adhesion layer 162 is to form a strong bond between the bonding layer 138 and the resonator 134. The wetting layer 142 forms an alloy with the indium in the bonding layer 138, thereby permitting the adhesion layer 162 to bond with the bonding layer 138. Additionally, the first adhesion layer 158 needs to be electrically conductive in order to complete the electrical path from the step region 195 to the surface of the piezoelectric crystal 130. Furthermore, the adhesion layers 158 and 162 may prevent (block) the indium or tin in the bonding layer 138 from reacting with the crystal 130 and/or the resonator 134, respectively.

An additional two layers are disposed on a back side of the piezoelectric crystal 130 (i.e. on the side facing away from the resonator 134). Specifically, a third adhesion layer 169 and a metal layer 170 are positioned on the back side of the piezoelectric crystal 130. The layers 169 and 170 cover substantially all of the surface area of the back side of the crystal 130. In the preferred embodiment, the third adhesion layer 169 comprises an approximately 5000 Å thick layer of an alloy comprised of chrome and a nickel copper alloy, such as the alloys marketed under the trademarks Nickel 400™ or MONEL™. However, other materials and/or thicknesses could also be used as the third adhesion layer 169. The function of the third adhesion layer 169 is to promote adhesion of the metal layer 170 to the crystal 130.

Preferably, the metal layer 170 comprises silver, although other electrically conductive metals such as nickel could also be used. Generally, the crystal 130 is obtained from commercial sources without the layers 169 and 170. The layers 169 and 170 are then applied to the piezoelectric crystal 130 using a sputtering technique such as physical vapor deposition (PVD). The layer 170 functions as an electrode to conduct electricity from a set of the spring/button connectors shown in FIG. 1, so as to set up a voltage across the crystal 130. Since the third adhesion layer 169 is also electrically conductive, both of the layers 169 and 170 actually function as an electrode.

In the preferred embodiment, the bonding layer 138 comprises pure indium (99.99%) such as is commercially available from Arconium or Indalloy. However, indium alloys containing varying amounts of impurity metals can also be used, albeit with less satisfactory results. The benefit of using indium and its alloys is that indium possesses excellent shear properties that allow dissimilar materials with different coefficients of expansion to be attached together and experience thermal cycling (i.e. expansion and contraction at different rates) without damage to the attached materials or to the resonator 134. The higher the purity of the indium, the better the shear properties of the system 124 will be. If the components of the acoustic transducer system 124 have similar coefficients of expansion, then less pure indium can be used because shear factors are less of a concern. Less pure indium (i.e. alloys of indium) has a higher melting point then pure indium and thus may be able to tolerate more heat. Similarly, when tin is used as the bonding layer 138, it is preferable to use pure tin (99.99% tin). However, tin containing varying amounts of impurities, including other metals, can also be used.

Depending upon the requirements of a particular cleaning task, the composition of the resonator 134 is selected from a group of chemically inert materials. For example, inert materials that work well as the resonator 134 include sapphire, quartz, silicon carbide, silicon nitride, aluminum, stainless steel and ceramics. One purpose of the resonator 134 is to separate (isolate) the piezoelectric crystal 130 from the fluid used in 20 the cleaning process, so that the fluid does not damage the crystal 130. Additionally, it is unacceptable for the resonator 134 to chemically react with the cleaning fluid. Thus, the material used as the resonator 134 is usually dictated, at least in part, by the nature of the cleaning fluid. Sapphire is a desirable material for the resonator 134 when the items to be cleaned by the megasonic cleaning apparatus require parts per trillion purity. For example, semiconductor wafers require this type of purity. A hydrogen fluoride (HF) based cleaning fluid might be used in a cleaning process of this type for semiconductor wafers.

The resonator 134 must also be able to transmit the acoustic energy generated by the crystal 130 into the fluid. Therefore, the acoustic properties of the resonator 134 are important. Generally, it is desirable that the acoustic impedance of the resonator 134 be between the acoustic impedance of the piezoelectric crystal 130 and the acoustic impedance of the cleaning fluid in the fluid chamber 190 (shown in FIG. 6). Preferably, the closer the acoustic impedance of the resonator 134 is the acoustic impedance of the cleaning fluid, the better.

In one preferred embodiment, the resonator 134 is a piece of synthetic sapphire (a single crystal substrate of $Al_2O_3$). Preferably, the sapphire is high grade having a designation of 99.999% (5 9s+purity). When synthetic sapphire is used as the resonator 134, the thickness "v", illustrated in FIG. 5 is approximately six millimeters. It should be noted that other forms of sapphire could be used as the resonator 134, such as rubies or emeralds. However, for practical reasons such as cost and purity, synthetic sapphire is preferred. Additionally, other values for the thickness "v" can be used.

In the preferred embodiment, the thickness "v" of the resonator 134 is a multiple of one-half of the wavelength of the acoustic energy in the resonator 134, so as to minimize reflectance problems. For example, "v" is approximately six millimeters for sapphire and acoustic energy of approximately 925 KHz. The wavelength of acoustic energy in the resonator 134 is governed by the relationship shown in equation 1 below:

$$\lambda_{1/2}=v_L/2f \quad (1)$$

where, $v_L$=the velocity of sound in the resonator 134 (in mm/msec), f=the natural frequency of the piezoelectric crystal 130 (in MHz)

$\lambda_{1/2}$=one half the wavelength of acoustic energy in the resonator 134.

From equation 1, it follows that when the composition of the resonator changes or when the natural resonance frequency of the crystal 130 changes, the ideal thickness of the resonator 134 will change. Therefore, in all of the examples discussed herein, a thickness "v" which is a multiple of one-half of the wavelength λ could be used.

In another preferred embodiment, the resonator 134 is a piece of quartz ($SiO_2$—synthetic fused quartz). Preferably, the quartz has a purity of 99.999% (5 9s+purity). When quartz is used as the resonator 134, the thickness "v", illustrated in FIG. 5 is approximately three to six millimeters.

In another preferred embodiment, the resonator 134 is a piece of silicon carbide (SiC). Preferably, the silicon carbide has a purity of 99.999% (5 9s+purity, semiconductor grade). When silicon carbide is used as the resonator 134, the thickness "v", illustrated in FIG. 5 is approximately six millimeters.

In another preferred embodiment, the resonator 134 is a piece of silicon nitride ($Si_3N_4$). Preferably, the silicon nitride has a purity of 99.999% (5 9s+purity, semiconductor grade). When silicon nitride is used as the resonator 134, the thickness "v", illustrated in FIG. 5 is approximately six millimeters.

In another preferred embodiment, the resonator 134 is a piece of ceramic material. In this application, the term ceramic means alumina ($Al_2O_3$) compounds such as the material supplied by the Coors Ceramics Company under the designation Coors AD-998. Preferably, the ceramic material has a purity of at least 99.8% $Al_2O_3$. When ceramic material is used as the resonator 134, the thickness "v", illustrated in FIG. 5 is approximately six millimeters.

The acoustic transducer system 124 illustrated in FIG. 5 is prepared by the following method: Assuming that the resonator 134 is sapphire, the surface of the sapphire that will be adjacent to the adhesion layer 162 is cleaned by abrasive blasting or chemical or sputter etching. The adhesion layer 162 is then deposited on the resonator 134 using a physical vapor deposition ("PVD") technique, such as argon sputtering. More specifically, the chrome and nickel copper alloy (e.g. Nickel 400™ or MONEL™) that comprise the layer 162 are co-sputtered onto to the resonator 134 so that the layer 162 is comprised of approximately 50% chrome and 50% nickel copper alloy. The wetting (silver) layer 142 is then deposited on the adhesion layer 162 using argon sputtering. A plating technique could also be used in this step.

The piezoelectric crystal 130 is preferably purchased without any electrode layers deposited on its surfaces. The third adhesion layer 169 is then deposited on the crystal 130 using a PVD technique, such as argon sputtering. More specifically, the chrome and nickel copper alloy that comprise the layer 169 are co-sputtered onto to the crystal 130 so that the layer 169 is comprised of approximately 50% chrome and 50% nickel copper alloy (e.g. Nickel 400™ or MONEL™). The electrode (silver) layer 170 is then deposited on the adhesion layer 169 using argon sputtering. A plating technique could also be used in this step.

Similarly, the first adhesion layer 158 is deposited on the opposite face of the crystal 130 from the third adhesion layer 169 using a PVD technique like argon sputtering. More specifically, the chrome and nickel copper alloy that comprise the layer 158 are co-sputtered onto to the crystal 130 so that the layer 158 is comprised of approximately 50% chrome and 50% nickel copper alloy. The wetting (silver) layer 150 is then deposited on the adhesion layer 158 using argon sputtering. A plating technique could also be used in this step.

If indium is used as the bonding layer 138, the resonator 134 and the piezoelectric crystal 130 are both heated to approximately 200° C., preferably by placing the resonator 134 and the crystal 130 on a heated surface such as a hot-plate. When both pieces have reached a temperature of greater than 160° C., solid indium is rubbed on the surfaces of the resonator 134 and the crystal 130 which are to be attached. Since pure indium melts at approximately 157° C., the solid indium liquefies when it is applied to the hot surfaces, thereby wetting the surfaces with indium. It is sometimes advantageous to add more indium at this time by using the surface tension of the indium to form a "puddle" of molten indium.

If tin is used as the bonding layer 138, the procedure described in the preceding paragraph is used, but tin is used in place of indium and the resonator 134 and the crystal 130 are heated to approximately 240° C. Since pure tin melts at 231.9° C., the tin is not applied to the resonator 26 and the crystal 30 until both pieces have reached a temperature of approximately 240° C.

The resonator 134 and the piezoelectric crystal 130 are then pressed together so that the surfaces coated with indium or tin are in contact with each other, thereby forming the transducer system 124. The newly formed transducer system 124 is allowed to cool to room temperature so that the indium or tin solidifies. Preferably, the bonding layer 138 has a thickness "g" which is just sufficient to form a void free bond. In the preferred embodiment, "g" is approximately one mil (0.001 inches). It is thought that the thickness "g" should be as small as possible in order to maximize the acoustic transmission, so thicknesses less than one mil might be even more preferable. Thicknesses up to about 0.01 inches could be used, but the efficiency of acoustic transmission drops off when the thickness "g" is increased.

Preferably, the transducer system 124 is allowed to cool with the piezoelectric crystal 130 on top of the resonator 134 and the force of gravity holding the two pieces together. Alternatively, a weight can be placed on top of the piezoelectric crystal 130 to aide in the bonding of the indium or tin. Another alternative is to place the newly formed transducer system 124 in a clamping fixture.

Once the transducer system 124 has cooled to room temperature, any excess indium or tin that has seeped out from between the piezoelectric crystal 130 and the resonator 134, is removed with a tool or other means.

Figure 6:
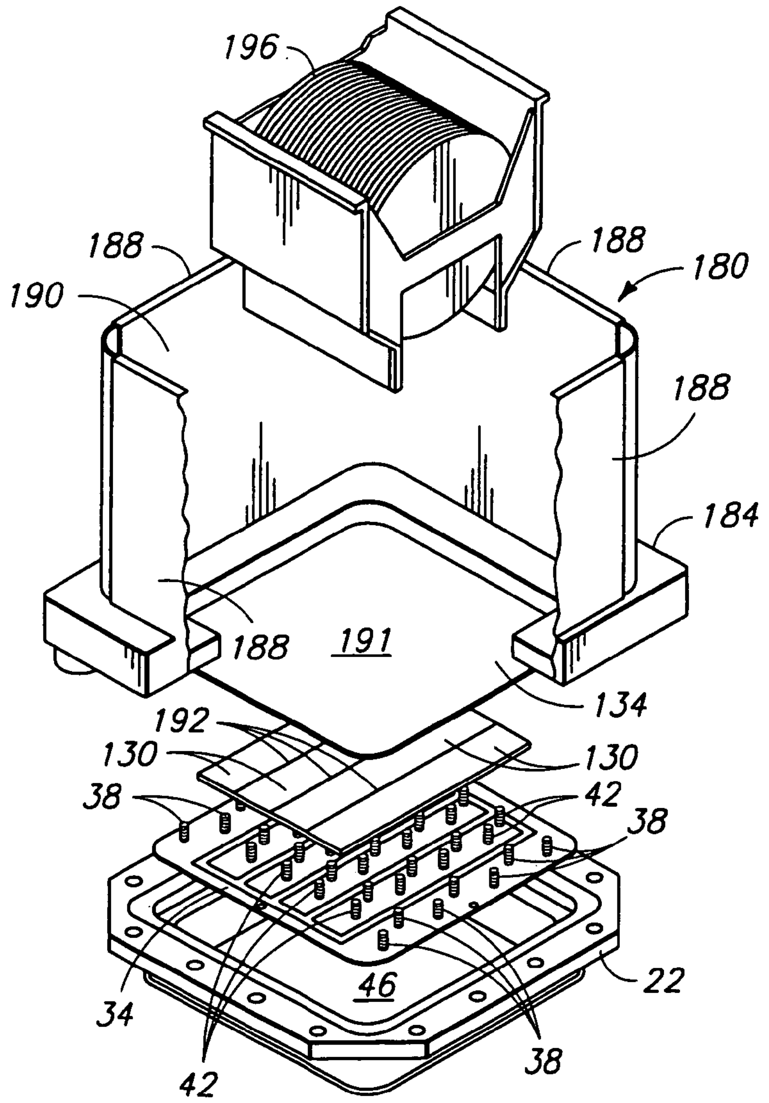
FIG. 6 is an exploded view of a megasonic cleaning system according to the present invention.

FIG. 6 illustrates a megasonic cleaning system 180 that utilizes the acoustic transducer system 124 (or the acoustic transducer 14). The cleaning solution is contained within a tank 184. In the preferred embodiment, the tank 184 is square-shaped and has four vertical sides 188. The resonator 134 forms a detachable bottom surface of the tank 184. Other shapes can be used for the tank 184, and in other embodiments, the resonator 134 can be a detachable portion of the bottom surface of the tank 184.

A fluid chamber 190 is the open region circumscribed by the sides 188. Since the sides 188 do not cover the top or bottom surfaces of the tank 184, the sides 188 are said to partially surround the fluid chamber 190. The fluid chamber 190 holds the cleaning solution so the walls 188 and the resonator 134 must make a fluid tight fit to prevent leakage. The resonator 134 has an interface surface 191 which abuts the fluid chamber 190 so that the interface surface 134 is in contact with at least some of the cleaning solution when cleaning solution is present in the fluid chamber 190. Obviously, the interface surface 191 is only in contact with the cleaning solution directly adjacent to the surface 191 at any point in time.

In the preferred embodiment shown in FIG. 6, four piezoelectric crystals 130 are used. In a typical preferred embodiment, each of the crystals is a rectangle having dimensions of 1 inch (width)×6 inch (length "k" in FIG. 5)×0.10 inch (thickness "s" in FIG. 5). Since the natural frequency of the crystal changes with thickness, reducing the thickness will cause the natural frequency of the crystal to be higher. As was indicated previously, other numbers of crystals can be used, other shapes for the crystals can be used and the crystals can have other dimensions such as 1.25×7×0.10 inches or 1.5×8×0.10 inches. Each of the crystals 130 are attached to the resonator 134 by the plurality of layers described previously with respect to FIG. 5. A gap 192 exists between each adjacent crystal 130 to prevent coupling of the crystals.

Figure 7:
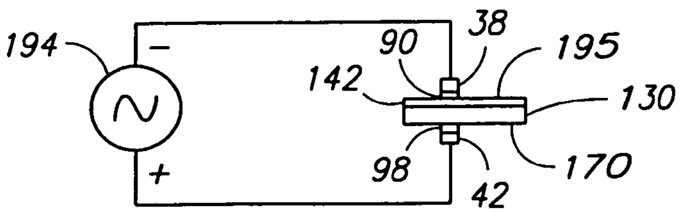
FIG. 7 is a schematic circuit diagram of the present invention.

The power for driving the crystals 130 is provided by a radiofrequency (RF) generator 194 (shown in FIG. 7). The electrical connections between the RF generator 194 and the crystals 130 are provided by the plurality of first spring/button connectors 38 and the plurality of second spring/button connectors 42, as was explained previously with respect to FIGS. 1 and 3. The plurality of second spring/button connectors 42 provide the active connection to the RF generator 194 and the plurality of first spring/button connectors 38 provide the ground connection to the RF generator 194.

The transducer system 124 includes the step-region 195 (shown in FIG. 5) which is exactly analogous to the step-region 110 described previously with respect to FIG. 2. The step region 195 is a region on the second wetting layer 142 that can be contacted by the upper buttons 90 of the spring/button connectors 38. Since all of the layers between the second wetting layer 142 and the crystal 130 are electrically conductive (i.e. the layers 138, 150 and 158), contact with the step region 195 is equivalent to contact with the surface front surface of the crystal 130. The upper buttons 98 of the spring/button connectors 42 make electrical contact with the metal layer 170 to complete the circuit for driving the PZT crystal 130. This circuit is represented schematically in FIG. 7.

Referring to FIG. 6, the printed circuit board (PCB) 34 and the piezoelectric crystal 130 are positioned in a cavity 46 and are surrounded by the housing 22 as was described previously with respect to FIG. 1. A plurality of items 196 to be cleaned are inserted through the top of the tank 184.

The acoustic transducer system 124 (illustrated in FIG. 5) functions as described below. It should be noted that the transducer 14 (illustrated in FIG. 2) works in the same manner as the acoustic transducer system 124. However, for the sake of brevity, the components of the system 124 are referenced in this discussion.

A radiofrequency (RF) voltage supplied by the RF generator 194 creates a potential difference across the piezoelectric crystal 130. Since this is an AC voltage, the crystal 130 expands and contracts at the frequency of the RF voltage and emits acoustic energy at this frequency. Preferably, the RF voltage applied to the crystal 130 has a frequency of approximately 925 KHZ. However, RF voltages in the frequency range of approximately 0.4 to 2.0 MHZ can be used with the system 124, depending on the thickness and natural frequency of the crystal 130. A 1000 watt RF generator such as is commercially available from Dressler Industries of Strohlberg, Germany is suitable as the RF generator 194.

In the preferred embodiment, only one of the crystals 130 is driven by the RF generator at a given time. This is because each of the crystals 130 have different natural frequencies. In the preferred embodiment, the natural frequency of each crystal 130 is determined and stored in software. The RF generator then drives the first crystal at the natural frequency indicated by the software for the first crystal. After a period of time (e.g. one millisecond), the RF generator 194 stops driving the first crystal and begins driving the second crystal at the natural frequency indicated by the software for the second crystal 130. This process is repeated for each of the plurality of crystals. Alternatively, the natural frequencies for the various crystals 130 can be approximately matched by adjusting the geometry of the crystals, and then driving all of the crystals 130 simultaneously.

Most of the acoustic energy is transmitted through all of the layers of the system 124 disposed between the crystal 130 and the resonator 134, and is delivered into the cleaning fluid. However, some of the acoustic energy generated by the piezoelectric crystal 130 is reflected by some or all of these layers. This reflected energy can cause the layers to heat up, especially as the power to the crystal is increased.

In the present invention, the bonding layer 138 has an acoustic impedance that is higher than the acoustic impedance of other attachment substances, such as epoxy. This reduces the amount of reflected acoustic energy between the resonator 134 and the bonding layer 138. This creates two advantages in the present invention. First, less heat is generated in the transducer system, thereby allowing more RF power to be applied to the piezoelectric crystal 130. For example, in the transducer system illustrated in FIG. 5, 25 to 30 watts/cm$^2$ can be applied to the crystal 130 (for an individually excited crystal) without external cooling. Additionally, the system 124 can be run in a continuous mode without cooling (e.g. 30 minutes to 24 hours or more), thereby allowing better cleaning to be achieved. In contrast, prior art systems use approximately 7 to 8 watts/cm$^2$, without external cooling. Prior art megasonic cleaning systems that operate at powers higher than 7 to 8 watts/cm$^2$ in a continuous mode require external cooling of the transducer.

Second, in the present invention, the reduced reflectance allows more power to be delivered into the fluid, thereby reducing the amount of time required in a cleaning cycle. For example, in the prior art, a cleaning cycle for sub 0.5 micron particles generally requires fifteen minutes of cleaning time. With the present invention, this time is reduced to less than one minute for many applications. In general, the use of the bonding layer 138 permits at least 90 to 98% of the acoustic energy generated by the piezoelectric crystal 130 to be transmitted into the cleaning fluid when the total power inputted to the piezoelectric crystal 130 is in the range of 400 to 1000 watts (e.g. 50 watts/cm$^2$ for a crystal 130 having an area of 20 cm$^2$). In the preferred embodiment, the bonding layer 138 attenuates the acoustic energy that is transmitted into the volume of cleaning fluid by no more than approximately 0.5 dB. It is believed that the system 124 can be used with power as high as 5000 watts. In general, the application of higher power levels to the piezoelectric crystal 130 results in faster cleaning times. It may also lead to more thorough cleaning.

Table 1 below indicates the power levels that can be utilized when the indicated materials are used as the resonator 134 in the system 124. The input wattage (effective power) is defined as the forward power into the crystal 130 minus the reflected power back into the RF generator 194. As indicated above, the system 124 allows at least approximately 90 to 98% of the input wattage to be transmitted into the cleaning solution.

TABLE 1

| Resonator | Input Wattage/$cm^2$ |
|---|---|
| Quartz | 12.5 watts/$cm^2$ |
| Silicon carbide or silicon nitride | 20 watts/$cm^2$ |
| Stainless steel | 25 watts/$cm^2$ |
| Ceramic | 40 watts/$cm^2$ |
| Sapphire | 50 watts/$cm^2$ |

Figure 8:
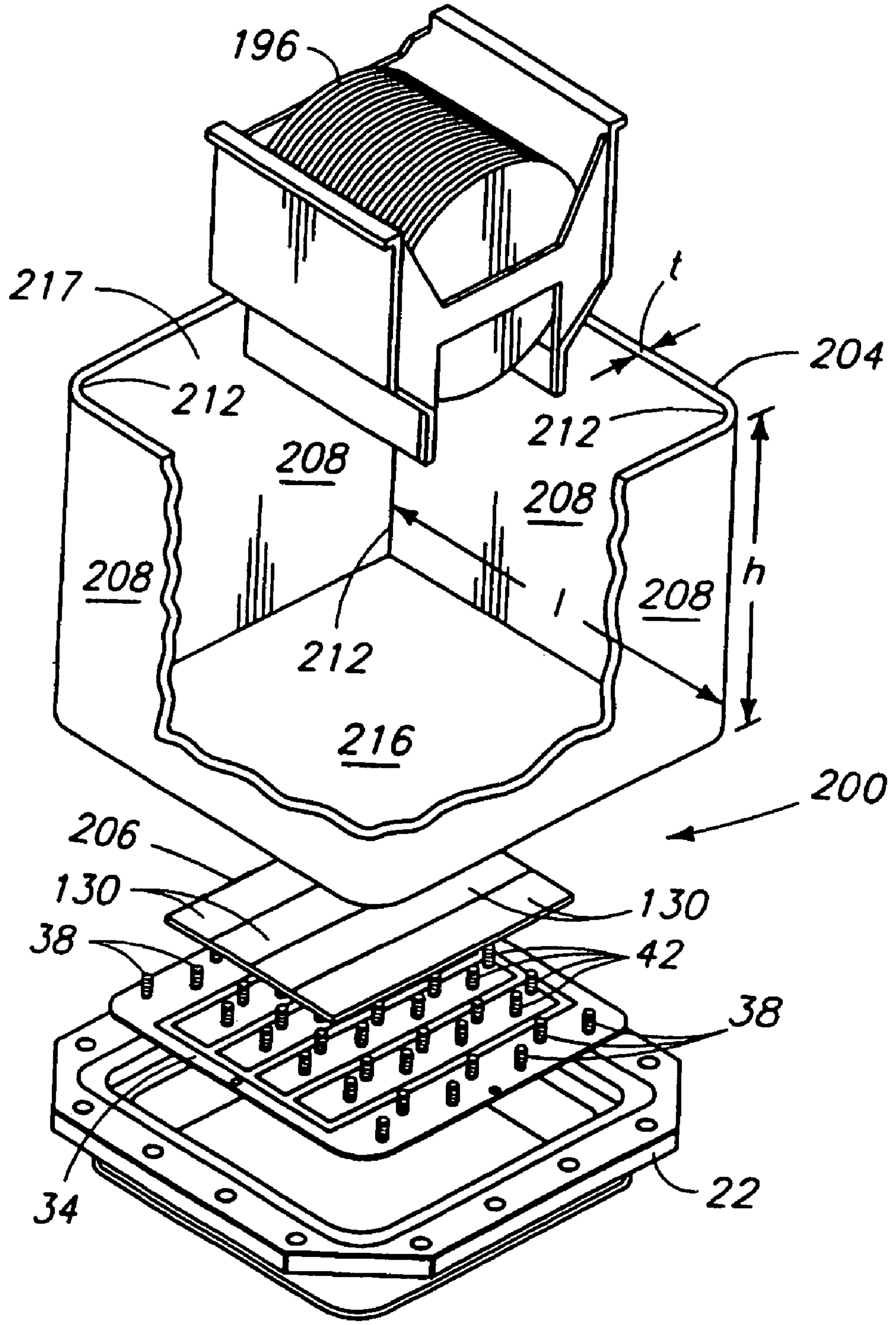
FIG. 8 is an exploded view of a single-piece tank megasonic cleaning system according to the present invention.

FIG. 8 illustrates a megasonic cleaning system 200 comprised of a tank 204, which is a one-piece vessel, and an acoustic transducer system 206. The system 200 is similar to the system 180 (shown in FIG. 6), and elements in the system 200 that are identical to corresponding elements in the system 180 are referred to with the same reference numerals. The tank 204 is comprised entirely of a single material such as quartz, silicon carbide, silicon nitride, ceramics, aluminum or stainless steel. Sapphire could also be used, but would be extremely expensive. Representative specifications for these materials, including source, purity and thickness "v", were described previously with respect to FIG. 5. When the constraints of equation 1 are taken into consideration, the preferred thicknesses of the side 208 or the bottom 216 to which the crystals 130 are attached are three, six or nine millimeters for quartz and stainless steel tanks.

In the preferred embodiment, the tank 204 is square-shaped and has four vertical sides 208, having corners 212 which are preferably curved. A bottom 216 is positioned perpendicular to the four sides 208, so that the tank 204 forms a hollow cube with the top of the tank 204 being open. A fluid chamber 217 (analogous to the fluid chamber 190 shown in FIG. 5) for accepting the cleaning fluid is the open region circumscribed by the sides 208 and the bottom 216. In FIG. 8, a portion of the sides 208 have been cut away to illustrate the bottom 216, but in an actual tank, no such cut away section exists. In a representative tank, the sides 208 have a height "h" of approximately forty centimeters (cm), a length "l" of approximately thirty cm, and a thickness "t" of approximately six millimeters (mm). Other dimensions or shapes can be used for the tank 184, such as a rectangle, but the symmetry of a square tank is preferred. In alternate embodiments, the sides 208 may be angled to focus the acoustic energy.

Preferably, the tank 204 comprises a single continuous piece of the material from which it is constructed so that there are no mechanical joints where the sides or bottom of the tank come together. For example, where the tank 204 comprises quartz, the sides 208 and bottom 216 are continuous, without a seam or joint between them, so that the tank 204 comprises a single continuous piece of quartz. The advantage in using a tank comprised of a single continuous piece of material is that there are no cracks or other voids at the interfaces between the sides 208 and between the sides 208 and the bottom 216, where particles or other contaminates could accumulate. Thus, the system 200 is used in cleaning situations where an extremely high degree of cleanliness is required, even by integrated circuit manufacturing standards. The single piece construction also allows a quartz tank to withstand higher cleaning temperatures.

In the system 200, the acoustic transducer system 206 is attached directly to the bottom 216, or to one of the sides 208, of the tank 204, using the bonding layer 138 (shown in FIG. 5). Therefore, in the system 200, the region of the side 208, or the region of the bottom 216, to which the piezoelectric crystals 130 are attached, functions as the resonator 134 (shown FIG. 5). This attachment of the crystal or crystals 130 directly to the tank 204 can be accomplished using the processes and materials that were described previously with respect to FIG. 5, or the processes and materials that were described with respect to FIG. 2. Specifically, the layers 158, 150, 138, 142 and 162 are positioned between the crystal 130 and the resonator 134. However, since the tank 204 may be too large to fit into a sputtering apparatus or into an evaporator, a third attachment process is described below that uses a different attachment process and materials.

Figure 9:
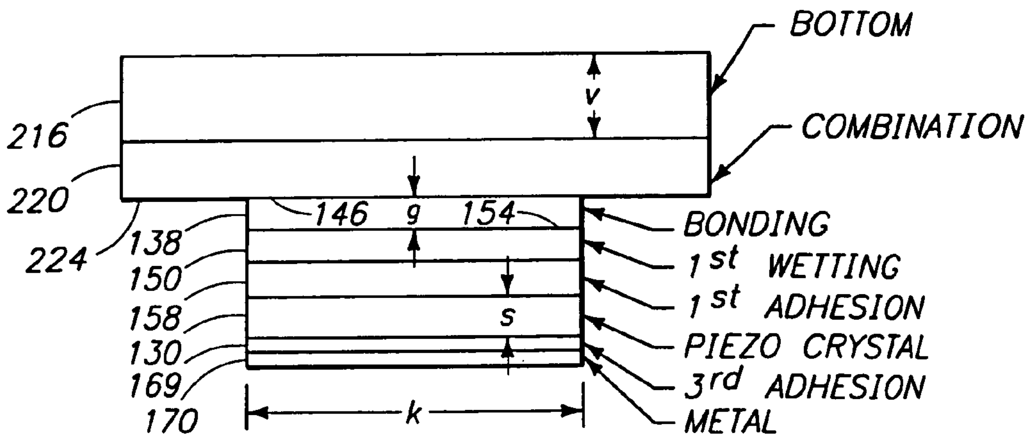
FIG. 9 is a side view of an acoustic transducer in which a one-piece tank is the resonator.

FIG. 9 illustrates the layers used in the third attachment process. Layers that are identical to the layers described previously with respect to FIG. 5 are identified with the same reference numerals used in FIG. 5. Inspection of FIG. 9 shows that the bottom 216 of the tank 204 is now in the position of the resonator 124 shown in FIG. 5. Additionally, a combination layer 220 has replaced the second adhesion layer 162 and the second wetting layer 142 shown in FIG. 5. The combination layer 220 is positioned between the bottom 216 and the bonding layer 138. It should be appreciated that the crystal (or crystals) 130 could be attached to one of the sides 208 instead of to the bottom 216. In the description below, attachment to the bottom 216 is described, but the same procedure can be used for attachment to one of the sides 208. As was described previously with respect to FIG. 5, the bonding layer 138 can be comprised of either indium or tin.

Typically, the combination layer 220 is applied to a region of the bottom 216 to which the crystal or crystals 130 will be attached. This region does not cover the entire surface area of the bottom 216, but it is preferably larger than the surface area of the crystal or crystals 130. This allows a portion of the combination layer 220 to function as a step region 224. The step region 224 functions like the step regions 195 and 110 described previously with respect to FIGS. 5 and 2, respectively.

In the preferred embodiment, the combination layer 220 is a conductive silver emulsion (paste) that is applied to the bottom 216. An acceptable emulsion is the commercially available product referred to as the 2617D low temperature silver conductor, available from EMCA-REMAX Products, of Montgomeryville, Pa. The layer 220 is applied directly to the bottom 216 using screen printing techniques, thereby avoiding the need to place the tank 204 inside of a sputtering or evaporation apparatus as would be needed if the layers 162 and 142 were used.

In the preferred embodiment, the layer 220 is applied as follows: The outside surface of the bottom 216 is cleaned, such as by bead blasting. A 325 mesh stainless steel screen is placed over the outside surface of the bottom 216 and an approximately 0.5 mil thick layer of the 2617D low temperature silver conductor paste is coated over the screen. The screen is then removed from the bottom 216 and the bottom 216 is allowed to air dry at room temperature for two to five minutes. The entire tank 204 is then placed in a convection oven and dried at approximately 150° C. for approximately ten minutes. This process results in the tank 204 having the layer 220 firmly coated on the outside surface of the bottom 216. The layer 220 has a thickness of approximately ten to twenty-five microns (10–25×$10^{-6}$ m).

The piezoelectric crystal (or crystals) 130 is then attached to the bottom 216 with the bonding layer 138 using the technique described previously with respect to FIG. 5. Specifically, the piezoelectric crystal 130 is preferably purchased without any electrode layers deposited on its surfaces. The third adhesion layer 169 is then deposited on the crystal 130 using a PVD technique, such as argon sputtering. More specifically, the chrome and nickel copper alloy that comprise the layer 169 are co-sputtered onto to the crystal 130 so that the layer 169 is comprised of approximately 50% chrome and 50% nickel copper alloy (e.g. Nickel 400™ or MONEL™). The electrode (silver) layer 170 is then deposited on the adhesion layer 169 using argon sputtering. A plating technique could also be used in this step.

Similarly, the first adhesion layer 158 is deposited on the opposite face of the crystal 130 from the third adhesion layer 169 using a PVD technique like argon sputtering. More specifically, the chrome and nickel copper alloy that comprise the layer 158 are co-sputtered onto to the crystal 130 so that the layer 158 is comprised of approximately 50% chrome and 50% nickel copper alloy. The wetting (silver) layer 150 is then deposited on the adhesion layer 158 using argon sputtering. A plating technique could also be used in this step.

The bottom 216 and the piezoelectric crystal 130 are attached as follows: If indium is used as the bonding layer 138, the bottom 216 and the crystal 130 are both heated to approximately 200° C., preferably by placing the bottom 216 and the crystal 130 on a heated surface such as a hot-plate. When both pieces have reached a temperature of greater than 160° C., solid indium is rubbed on the surfaces of the bottom 216 and the crystal 130 which are to be attached (i.e. the indium is rubbed on the layer 220 and on the first wetting layer 150). Since pure indium melts at approximately 157° C., the solid indium liquefies when it is applied to the hot surfaces, thereby wetting the surfaces with indium. It is sometimes advantageous to add more indium at this time by using the surface tension of the indium to form a “puddle” of molten indium.

If tin is used as the bonding layer 138, the procedure described in the preceding paragraph is used, but tin is used in place of indium, and the bottom 216 and the crystal 130 are heated to approximately 240° C. Since pure tin melts at 231.9° C., the tin is not applied to the bottom 216 and the crystal 130 until both pieces have reached a temperature of approximately 240° C.

The tank 204 (bottom 216) and the piezoelectric crystal 130 are then pressed together so that the surfaces coated with indium or tin are in contact with each other, thereby forming the transducer system 200. The newly formed transducer system 200 is allowed to cool to room temperature so that the indium or tin solidifies. Preferably, the bonding layer 138 has a thickness “g” which is just sufficient to form a void free bond. In the preferred embodiment, “g” is approximately one mil (0.001 inches). It is thought that the thickness “g” should be as small as possible in order to maximize the acoustic transmission, so thicknesses less than one mil might be even more preferable. Thicknesses up to about 0.01 inches could be used, but the efficiency of acoustic transmission drops off when the thickness “g” is increased.

Preferably, the transducer system 200 is allowed to cool with the piezoelectric crystal 130 on top of the bottom 216 and the force of gravity holding the two pieces together. Alternatively, a weight can be placed on top of the piezoelectric crystal 130 to aide in the bonding of the indium or tin. Another alternative is to place the newly formed transducer system 200 in a clamping fixture.

The transducer system 200 functions in a similar manner to the system 124 described previously with respect to FIG. 5. The only difference is that the resonator 134 of FIG. 5 is replaced with the region of the tank 204 to which the crystals 130 are attached (i.e. either a region of the bottom 216 or a region of the sides 208).

As was mentioned previously, the combination layer 220 can be replaced by the second adhesion layer 162 and the second wetting layer 142. Suitable materials and processes for utilizing the second adhesion layer 162 and the second wetting layer 142 were described previously with respect to FIG. 5. For example, the second adhesion layer 162 may be comprised of chromium, copper and nickel and is positioned in contact with a surface of the tank. The second wetting layer 142 may be comprised of silver and is positioned between the second adhesion layer 162 and the bonding layer 138 for helping the bonding layer bond to the second adhesion layer 162. Similarly, the combination layer 220 can be replaced by the blocking adhesion layer 84 and the first metal layer 64 described previously with respect to FIG. 2. The drawback to both of these embodiments is that the whole tank 204 may have to be placed in a physical vapor deposition (PVD) chamber so that the layers 162 and 142, or 84 and 64, can be sputtered onto the tank 204.

Figure 10:
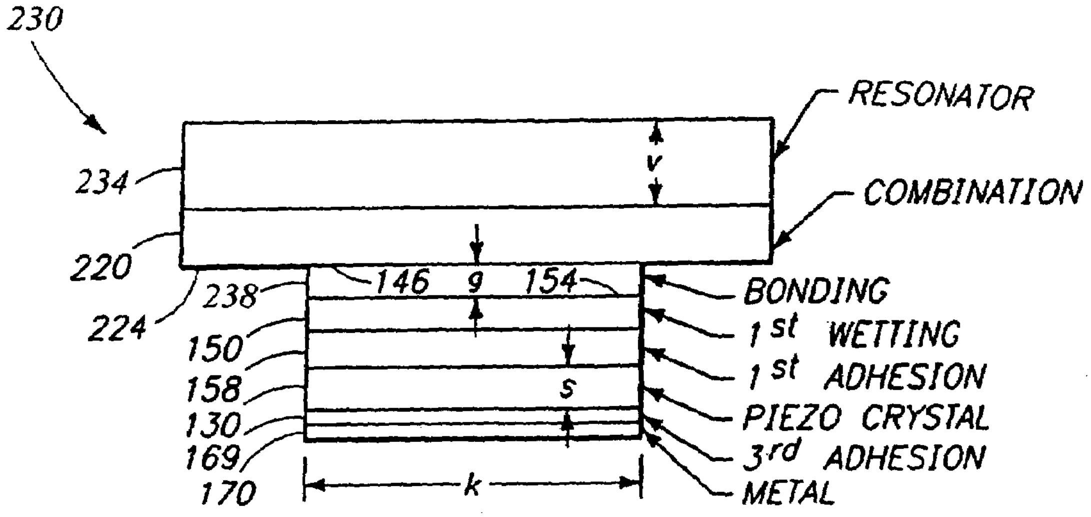
FIG. 10 is a side view of an acoustic transducer in which the resonator can be a one-piece tank or a strip resonator according to the present invention.

FIG. 10 illustrates an embodiment of an acoustic transducer system 230 in which the combination layer 220 is positioned between a resonator 234 and a bonding layer 238. The system 230 is similar to the acoustic transducer system 206 shown in FIG. 9, and layers shown in FIG. 10 that are identical to the layers described previously with respect to FIG. 9 are identified with the same reference numerals used in FIG. 9.

In FIG. 10, the resonator 234 can be a piece of material that is not originally part of the cleaning tank such as the resonator 134 shown in FIGS. 5 and 6, or the resonator 26 shown in FIGS. 1 and 2. The resonator 234 is comprised of the same materials described previously with respect to the resonators 26 and 134. Specifically, the resonator 234 is comprised entirely of a single material such as quartz, sapphire, silicon carbide, silicon nitride, aluminum, ceramics or stainless steel. In general, when aluminum is used as the resonator 234, the surface of the resonator 234 that is in contact with the cleaning fluid, is coated or modified to reduce the reactivity of the aluminum with the cleaning fluid. Coatings that can be used include Teflon or Kynar. Modifications of the aluminum surface that can be used include hard coat anodizing (i.e. anodization with sulfuiric acid) or other types of anodization. These same considerations about aluminum apply when using aluminum as the resonators 26 or 134, shown in FIGS. 2 and 5, or as the bottom 216 shown in FIG. 9.

In FIG. 10, the bonding layer 238 comprises either indium or tin. If the bonding layer 238 comprises indium, the system 230 is constructed with the same materials that were described previously with respect to FIGS. 2, 5 and 9. When tin is used as the bonding layer 238, it is preferable to use relatively pure tin, such as 99.99% pure tin, and the system 230 is constructed as follows.

The combination layer 220 is applied to the resonator 234 as was described previously with respect to FIG. 9. Specifically, a surface of the resonator 234 is cleaned, such as by bead blasting. A stainless steel screen (preferably 325 mesh)

is placed over the cleaned surface of the resonator 234 and an approximately 0.5 mil thick layer of silver conductor paste (preferably 2617D low temperature silver conductor paste) is coated over the screen and the paste is forced through the screen. The screen is then removed and the resonator 234 is allowed to air dry at room temperature for two to five minutes. The resonator 234 is then placed in a convection oven and dried at approximately 150° C. for approximately ten minutes. Note that if the resonator is an integral part of the tank, then the entire tank is placed in the oven, as was described previously with respect to FIG. 9.

The piezoelectric crystal (or crystals) 130 is then attached to the resonator 234 with the bonding layer 238 using a similar technique to the one described previously with respect to FIG. 9. Specifically, the piezoelectric crystal 130 is preferably purchased without any electrode layers deposited on its surfaces. The third adhesion layer 169 and the metal layer 170 are then applied to the crystal 130 as was described previously with respect to FIG. 9. Similarly, the first adhesion layer 158 is deposited on the opposite face of the crystal 130 from the third adhesion layer 169, and the wetting (silver) layer 150 is then deposited on the adhesion layer 158.

The resonator 234 and the crystal 130 are attached using the technique described previously with respect to FIGS. 2, 5 and 9. Specifically, when tin is used as the bonding layer 238, the resonator 234 and the piezoelectric crystal 130 are both heated to approximately 240° C., preferably by placing the resonator 234 and the crystal 130 on a heated surface such as a hot-plate. When both pieces have reached a temperature of approximately 240° C., solid tin is rubbed on the surfaces of the resonator 234 and the crystal 130 which are to be attached (i.e. the tin is rubbed on the layer 220 and on the first wetting layer 150). Since pure tin melts at approximately 231.9° C., the solid tin liquefies when it is applied to the hot surfaces, thereby wetting the surfaces with tin. It is sometimes advantageous to add more tin at this time by using the surface tension of the tin to form a "puddle" of molten tin.

When indium is used as the bonding layer 238, the procedure used in the preceding paragraph is used, but indium is used in place of tin, and the resonator 234 and the crystal 130 are heated to approximately 200° C.

The resonator 234 and the piezoelectric crystal 130 are then pressed together so that the surfaces coated with tin or indium are in contact with each other, thereby forming the transducer system 230. The newly formed transducer system 230 is allowed to cool to room temperature so that the tin or indium solidifies. Preferably, the bonding layer 238 has a thickness "g" which is just sufficient to form a void free bond. In the preferred embodiment, "g" is approximately one mil (0.001 inches). It is thought that the thickness "g" should be as small as possible in order to maximize the acoustic transmission, so thicknesses less than one mil might be even more preferable. Thicknesses up to about 0.01 inches could be used, but the efficiency of acoustic transmission drops off when the thickness "g" is increased.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. A transducer comprising:

an acoustic energy generating means for generating acoustic energy;

a resonator for transmitting the acoustic energy into a volume of liquid, the resonator being adapted for positioning between the acoustic energy generating means and the volume of liquid; and a bonding layer comprised of indium or tin positioned between the resonator and the acoustic energy generating means for attaching the acoustic energy generating means to the resonator.

2. The transducer of claim 1 wherein the acoustic energy generating means comprises a piezoelectric crystal.

3. The transducer of claim 1 wherein the acoustic energy has a frequency greater than 0.4 MHz.

4. The transducer of claim 1 wherein the resonator comprises a material selected from the group consisting of quartz, sapphire, silicon carbide, silicon nitride, aluminum, ceramics and stainless steel.

5. The transducer of claim 1 wherein the bonding layer comprises indium having a purity of at least 99.99%.

6. The transducer of claim 1 wherein the bonding layer comprises tin having a purity of at least 99.99%.

7. A cleaning system comprising:

a container having a fluid chamber for holding a volume of cleaning solution;

an acoustic energy generating means for generating acoustic energy;

a resonator for transmitting the acoustic energy into the volume of cleaning solution, the resonator having an interface surface which abuts the fluid chamber so that the interface surface is in contact with at least some of the volume of cleaning solution when the volume of cleaning solution is present in the fluid chamber; and a bonding layer comprised of indium or tin positioned between the resonator and the acoustic energy generating means for attaching the acoustic energy generating means to the resonator.

8. The cleaning system of claim 7 wherein the container comprises a one-piece vessel and the resonator is part of the one-piece vessel.

9. The cleaning system of claim 7 wherein the resonator comprises a material selected from the group consisting of quartz, sapphire, silicon carbide, silicon nitride, aluminum, ceramics and stainless steel.

10. The cleaning system of claim 7 wherein the acoustic energy generating means comprises a piezoelectric crystal.

11. The cleaning system of claim 7 wherein the acoustic energy has a frequency greater than 0.4 MHz.

12. The cleaning system of claim 7 wherein the bonding layer comprises indium having a purity of at least 99.99%.

13. The cleaning system of claim 7 wherein the bonding layer comprises tin having a purity of at least 99.99%.

14. A transducer comprising:

an acoustic energy generating means for generating acoustic energy;

a resonator for transmitting the acoustic energy into a volume of cleaning fluid and adapted for positioning between the acoustic energy generating means and the volume of cleaning fluid;

a bonding layer comprised of tin or indium positioned between the resonator and the acoustic energy generating means for attaching the acoustic energy generating means to the resonator; and a combination layer positioned between the bonding layer and the resonator, the combination layer functioning at least as a wetting layer to facilitate attachment of the bonding layer to the resonator.

15. The transducer of claim 14 wherein the combination layer comprises a silver emulsion that is applied to the resonator using a screen process.

16. The transducer of claim 14 wherein the resonator comprises a material selected from the group consisting of quartz, sapphire, silicon carbide, silicon nitride, aluminum, ceramics and stainless steel.

17. The transducer of claim 14 wherein the acoustic energy generating means comprises a piezoelectric crystal.

18. The transducer of claim 14 wherein the acoustic energy has a frequency greater than 0.4 MHz.

19. The transducer of claim 14 wherein the bonding layer comprises indium having a purity of at least 99.99%.

20. The transducer of claim 14 wherein the bonding layer comprises tin having a purity of at least 99.99%.

* * * * *

UNITED STATES PATENT AND TRADEMARK OFFICE

CERTIFICATE OF CORRECTION

PATENT NO. : 7,141,917 B2
APPLICATION NO. : 11/150618
DATED : November 28, 2006
INVENTOR(S) : Beck et al.

It is certified that error appears in the above-identified patent and that said Letters Patent is hereby corrected as shown below:

On the Title page, after Item 63, cancel the text beginning with "Continuation of application No. 10/185,917 to and ending with Pat. No. 6,188,162.", and substitute therefor --Continuation of application No. 10/185,917, filed June 27, 2002, now Pat. No. 6,904,921, which is a continuation-in-part of application No. 09/841,703, filed Apr. 23, 2001, now Pat. No. 6,722,379, which is a continuation-in-part of application No. 09/543,204, filed Apr. 5, 2000, now Pat. No. 6,222,305, which is a continuation-in-part of application No. 09/384,947, filed Aug. 27, 1999, now Pat. No. 6,188,162.--

In the Specification

Column 1, line 4, cancel the text beginning with "This application" to and ending with "6,188,162." in column 1, line 10, and substitute therefor --This application is a continuation of Application No. 10/185,917, filed June 27, 2002, now U.S. Pat. No. 6,904,921, which is a continuation-in-part of Application No. 09/841,703, filed Apr. 23, 2001, now U.S. Pat. No. 6,722,379, which is a continuation-in-part of Application No. 09/543,204, filed Apr. 5, 2000, now U.S. Pat. No. 6,222,305, which is a continuation-in-part of Application No. 09/384,947, filed Aug. 27, 1999, now U.S. Pat. No. 6,188,162.--

Signed and Sealed this
Fourteenth Day of April, 2015

Michelle K. Lee

Michelle K. Lee
*Director of the United States Patent and Trademark Office*